United States Patent [19]
Gaultier et al.

[11] Patent Number: 4,947,375
[45] Date of Patent: Aug. 7, 1990

[54] ADDRESSING OF REDUNDANT COLUMNS AND ROWS OF AN INTEGRATED CIRCUIT MEMORY

[75] Inventors: Jean Marie Gaultier, Rousset sur Arc; Jean Devin, Aix en Provence, both of France

[73] Assignee: Thomson Semiconducteurs, Paris, France

[21] Appl. No.: 163,270

[22] Filed: Mar. 2, 1988

[30] Foreign Application Priority Data

Mar. 3, 1987 [FR] France ................. 87 02835

[51] Int. Cl.$^5$ .............................................. G11C 8/00
[52] U.S. Cl. .................................... 365/200; 371/10.3
[58] Field of Search ............... 365/189, 200, 96, 230, 365/189.01, 189.03, 230.06; 371/8, 10, 10.3

[56] References Cited

U.S. PATENT DOCUMENTS

| | | | |
|---|---|---|---|
| 3,753,244 | 8/1973 | Sumilas et al. | 365/200 |
| 4,047,163 | 9/1977 | Choate et al. | 365/200 X |
| 4,266,285 | 5/1981 | Panepinto, Jr. | 365/200 X |
| 4,346,459 | 8/1982 | Sud et al. | 365/200 |
| 4,473,895 | 9/1984 | Tatematsu | 365/200 |
| 4,654,830 | 3/1987 | Chua et al. | 365/200 |

FOREIGN PATENT DOCUMENTS 8001732 8/1980 World Int. Prop. O. .

OTHER PUBLICATIONS

Patent Abstracts of Japan, vol. 8, No. 151 (P-286) [1588], 13 Juillet 1984; and JP-A-59 48 898 (Hitachi Seisakusho K.K.), 21-03-1984.

Processing of the IEEE, vol. 74, No. 5, Mai 1986, pp. 684–698, IEEE, New York, US; W. R. Moore: "A Review of Fault-Tolerant Techniques for the Enhancement of Integrated Circuit Yeild", p. 684, colonne 2, ligne 22–colonne 2, ligne 16.

Primary Examiner—James W. Moffitt
Attorney, Agent, or Firm—Oblon, Spivak, McClelland, Maier & Neustadt

[57] ABSTRACT

A method for the addressing of redundant elements of an integrated circuit memory is disclosed. This memory comprises an array of row memory elements and column memory elements, respectively addressable by row addresses and column addresses, at least one battery of fuses to store the address of a faulty element of the memory. The method consists:

for one battery, in associating said battery with a row/column address pair;

in memorizing, through the blowing of certain fuses in the battery after the testing of a memory element, the address either of a column element if the faulty element is a column element or that of a row element if the faulty element is a row element;

and in enabling only the row addresses when the stored address is that of a row element or only the column addresses when the stored address is that of a column element, to address either a row redundant element or a column redundant element.

1 Claim, 2 Drawing Sheets

ADDRESSING OF REDUNDANT COLUMNS AND ROWS OF AN INTEGRATED CIRCUIT MEMORY

BACKGROUND OF THE INVENTION

1. Field of the Invention

The present invention relates to a method for the addressing of an integrated circuit memory and to a device which can be used to implement the method. It concerns, more particularly, a method for the addressing of redundant elements of the memory.

2. Description of the Prior Art

An integrated circuit memory usually comprises row memory elements, addressable by row addresses, and column memory elements, addressable by column addresses. The memory also comprises redundant memory elements designed to replace faulty elements of the memory. These redundant elements consist of row and column memory elements, the rows being also addressable by the row addresses and the columns by the column addresses.

When an element in the memory proves to be faulty, following a test of this memory, the address of this element is stored by a battery of fuses in which certain fuses are blown, so that the state of each blown fuse represents the address of the detected faulty element. The use of a battery of fuses for each faulty element is quite natural and usual. It is also natural and usual to use separate batteries for row elements and column elements. The current trend is towards the use of an increasing number of redundant elements, so that the number of fuse batteries is increasing. This increase is contributing, firstly, to greater bulk and, secondly, to greater risks of failure.

It is an object of the invention to reduce the space occupied by the batteries used for routing towards the redundant elements, by using only one battery for a row/column pair of the memory and by indicating, at the end of each row and column test, the nature of the routing operation through the blowing of a fuse. Consequently, the fact that a fuse is blown or not makes it possible to ascertain whether the faulty element is a row element or a column element. This permits directing the routing towards a row redundant element or towards a column redundant element.

SUMMARY OF THE INVENTION

The invention relates to a method for the addressing of an integrated circuit memory, comprising an array of row memory elements and column memory elements, respectively addressable through row addresses and column addresses, at least one battery of fuses to store the address of a faulty element of the memory, said method consisting:

for one battery, in associating this battery with a row-/column address pair;

in memorizing, through the blowing of certain fuses in the battery after the testing of a memory element, the address either of a column element if the faulty element is a column element or of a row element if the faulty element is a row element;

and in validating only the row addresses when the stored address is that of a row element or only the column addresses when the stored address is that of a column element, to address either a row redundant element or a column redundant element.

BRIEF DESCRIPTION OF THE DRAWINGS

The invention will be better understood from the following detailed description, given as a non-restrictive example and illustrated by the appended drawings in which.

DESCRIPTION OF A PREFERRED EMBODIMENT

Figure 1:
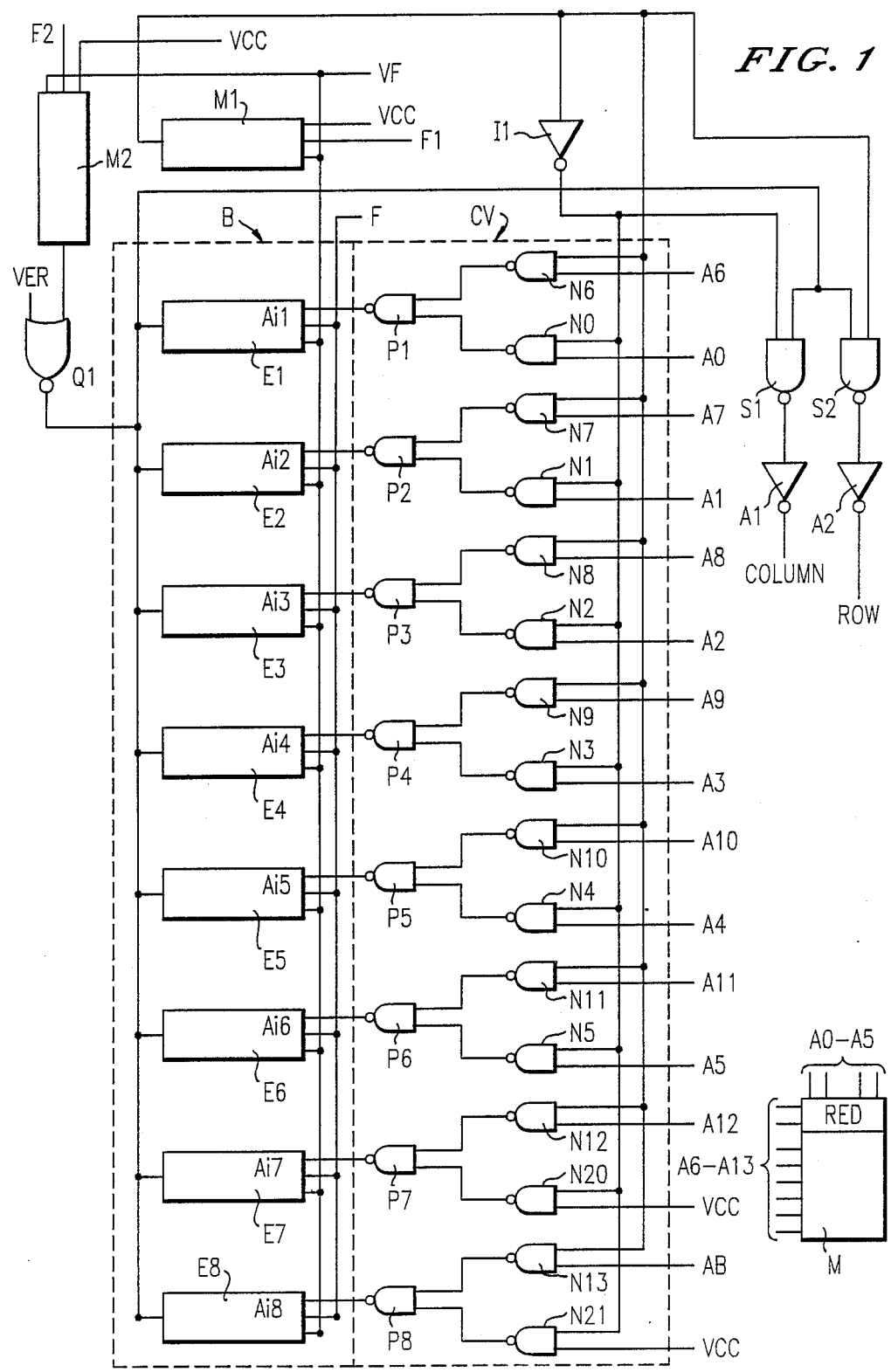
FIG. 1 shows a block diagram of an embodiment of the device for implementing the addressing method according to the invention.

FIG. 1 shows a block diagram of a device which can be used to implement the method according to the invention. The memory M is of standard form and therefore has been illustrated in a very schematic way. Of course, it comprises redundant elements RED and standard row/column addressing circuits (not shown). Only the elements B, CV, M1, M2, S1, S2, which provide for routing towards the redundant elements, are shown in detail.

The battery of fuses B, which is shown, can be used according to the method of the invention, to route a row address or a column address: this choice is made only at the time when the memory M is tested after the detection of a faulty element, depending on whether it is a row element or a column element. Unlike in the prior art, this makes it possible to use only one battery for a row/column pair, the choice being made after the test on the memory and not beforehand.

When, in the course of a test on the memory, a faulty element is detected, the testing unit, which has not been shown in this figure and is standard per se, controls the storage of the nature of the element through the blowing or non-blowing of a fuse in a storage element M1 designed for this purpose. For this, a breakdown control signal F1 is applied or not with an appropriate breakdown voltage VF. The fuse of the storage element is blown or not depending on whether the faulty element detected is a row element or a column element.

The testing unit will also control the blowing of a fuse of a storage element M2, the role of which is to indicate that there is a routing (or no routing, depending on its state) towards a redundant element. The output of the storage element M1 permits validating the row address inputs or the column address inputs of the enable circuit CV and thus to store the enabled addressing bits in the battery. The state of each fuse of the battery corresponds to an addressing bit of a row or column element address. For this purpose, the battery comprises as many storage elements as there are address bits to select a row, if it is assumed that the number of rows is greater than the number of column, which is generally the case. Should the number of columns be greater than the number of rows, the number of storage elements is then equal to the number of column addressing bits.

When the address of a row or a column of a faulty element is stored in the battery, the battery will make it possible, with the row selection or column selection storage elements M1 and redundant element selection storage element M2, to do a routing towards a redundant row element or a redundant column element. To that effect, the outputs of each element of the battery and the output of the selection element (via an exclusive NOR gate which is not necessary) are combined to be applied to an input with two NAND gates S1 and S2. A second input of the gate S1 receives the output signal of the row or column selection element M1 through an inverter I1 while the second input of the gate S2 receives this output signal directly. The gate S1 can be used, for example, to address the desired column redundancy element and the gate S2 can be used to address the desired row redundancy element. The output of each of the two gates S1 and S2 is applied to the respective input of an inverting gate A1, A2 to be matched with the logic of the circuit.

The enabling circuit CV comprises, for each storage element, a pair of NAND gates. A gate of each pair is designed to receive a row address bit at one of its inputs and a row enabling bit at its other input. The other gate receives a column address bit at one of its inputs and a column enabling bit at its other input. The inputs of the row address bits are numbered A6-A12 and the inputs of the column address bits are numbered A0-A5. The gate N6 and the gate N0 form an enabling pair for the addresses A6, A0. The gate N6 receives the address bit A6 and the output bit of the storage element M1. The gate N0 receives the address bit A0 and the output bit of this same element M1 through the inverting gate I1.

In this particular embodiment, the gate N20, which forms an enabling pair with the gate N12, no longer corresponds to a column address input since the number of column addresses is five and the address A5 is applied to the gate N5. This gate N20 therefore receives a voltage level VCC at one of its inputs. Similarly, the gate N21 which forms an enabling pair with the gate N13, no longer corresponds to a column address input for the same reasons as previously set forth.

The outputs of the two gates of a given pair are respectively connected to the input of a NAND gate. Thus the pair N6, N0 is connected to the gate P1 and the pair N13, N21 to the gate p8. The output of each gate P1-P8 is respectively connected to the address input of a storage element E1-E8, i.e. P1 to $A_i1$, P2 to $A_i2$ ... P8 to $A_i8$.

An exclusive-NOR gate Q1 is designed to receive the output signal of the selecting device M2 of the redundant element in order to enable a test of the redundancy elements before definitively assigning a redundancy element to the battery. For this purpose, the gate Q1 receives at one of its inputs a checking signal VER provided by the testing unit. This signal VER enables a read operation of the state of the tested row or column element. After this checking, if the redundant element is operative, the fuse of the element M2 is blown by the application of a breakdown voltage VF and a breakdown command F2. It is the output state of this element M2, and no longer the signal VER, which will provide for routing towards the desired redundant element together with the output state of the element M1.

Figure 2:
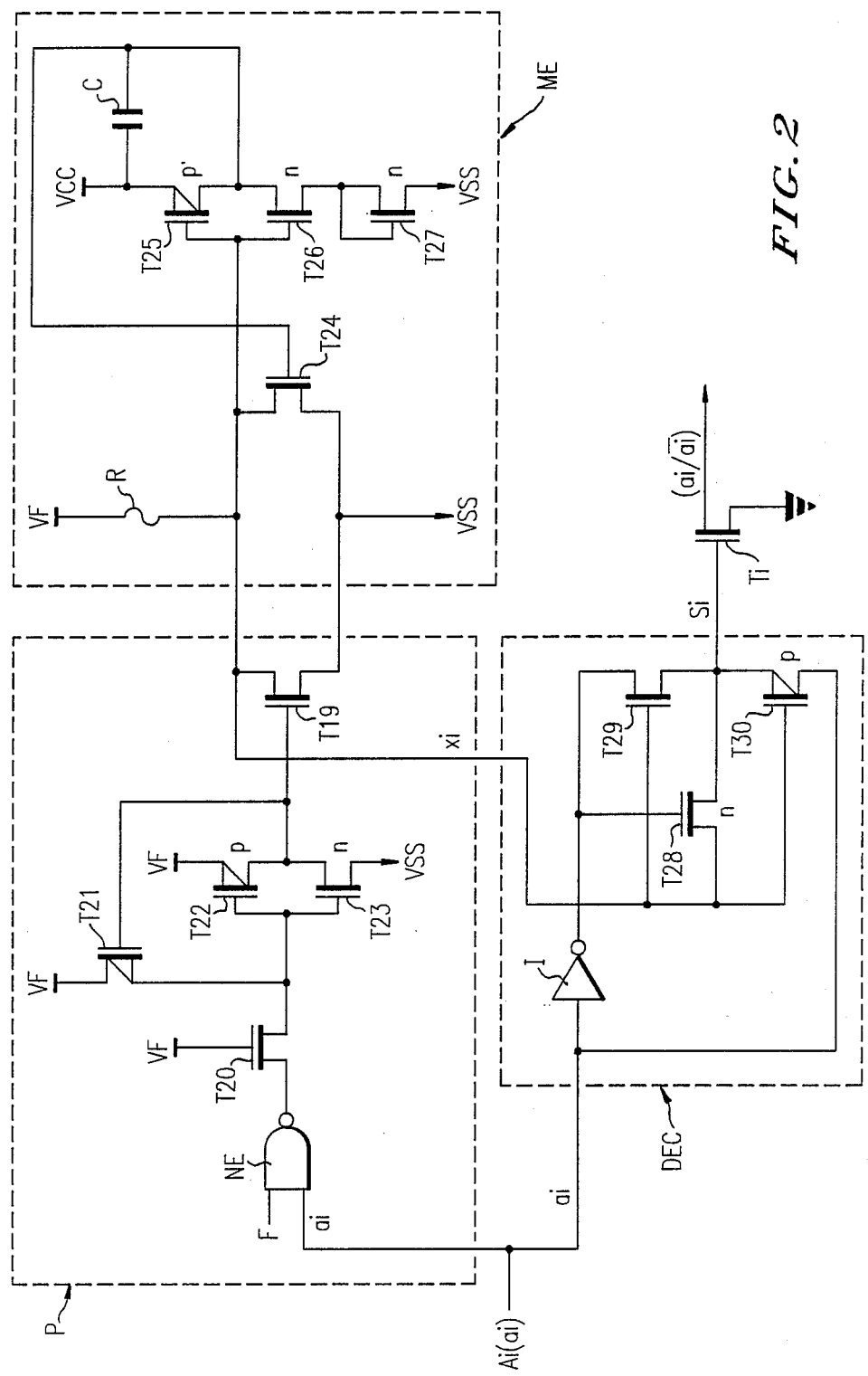
FIG. 2 shows a detailed diagram of an embodiment of a storage element according to FIG. 1.

FIG. 2 shows a detailed embodiment of an address storage element Ei, which is given as an illustrative example.

The address storage element Ei comprises a programming circuit P which receives the signal $a_i$ corresponding to an address bit Ai and the breakdown control voltage F of the fuse. Of course, the addresses Ai are the addresses enabled by the circuit CV. The circuit P which comprises a NAND gate NE and transistors T19 to T23, gives a signal which will cause the fuse R to be blown or not through the conduction (or non-conduction) of the transistor T19.

The storage element Ei also comprises a storage circuit ME which receives the breakdown voltage VF to blow the fuse R upon a command from the circuit P. This circuit ME comprises the fuse R, transistors T24 to T27 and a capacitor C and, during the reading of the state of the fuse, it delivers a state $x_i$ representing the state of the fuse.

The storage element Ei also comprises a decoder DEC, which also receives the signal $a_i$, corresponding to an address bit Ai, and the signal $x_i$, corresponding to the state of the fuse R. This decoder DEC delivers an output signal Si, the state of which is either $a_i$, if the state of the fuse actually corresponds to this state, or $\bar{a_i}$ ($a_i$ inverted) if the state of the fuse does not correspond to this state. The decoder DEC comprises an inverter I and the transistors T28 to T30. The output of this circuit DEC is connected to the gate of a transistor $T_i$ which has one electrode connected to the ground while its other electrode forms the output of the said storage element Ei. This output is connected to all the other outputs of the decoder DEC of the other storage elements of the battery B to form only one output.

The selection elements M1 and M2 are made identical to the address storage elements Ei but the input signals are different since a voltage VCC is applied to the address input of the gate NE, and different breakdown control signals, F1, F2, are applied to M1, M2 respectively. Therefore the circuit M1 receives a signal F1 at one of the inputs of the gate NE and the circuit M2 receives a signal F2 at one of the inputs of this gate NE, and the state of these signals causes the fuse R to be blown or not. The breakdown voltage VF is preferably provided by the same source for all the elements M1, M2, E1-E8.

To blow the fuses in a battery, namely to store a data, a low level is applied to all the address inputs of this battery, and then the voltage is increased until the breakdown voltage VF, usually 12 to 13 Volts, is obtained. Then the control voltage F, usually 0 to 5 Volts, is applied, and each element is addressed successively.

The inputs Ai1-Ai8 are designed to receive the signals corresponding to the address bits coming from the enable circuit CV.

The fuses that select the elements M1 and M2 receive, at the breakdown instant, a voltage VCC of 5 Volts for example (instead of an address bit).

Subsequently, when a write operation and then read operations are done in the memory, the output of the storage elements formed by the outputs of each of these elements E1-E8 is at 0 (or 1) if the address presented at the input of the battery has been stored by this battery, and the routing is done towards a row or column redundancy element depending on whether this address is a row address or a column address.

This specific example of a circuit has been achieved by means of CMOS technology, the transistors T20, T23, T19, T24, T27, T28 and T29 being N-channel MOS transistors and the transistors T21, T22, T25 and T30 being P-channel transistors.

What is claimed is:

1. An integrated circuit memory comprising an array of memory cells arranged in lines and columns, each line of memory cells addressable by means of a line address and each column of memory cells addressable by means of column address, said memory further comprising at least one redundant group of cells comprising a redundant line of cells and a redundant column of cells, with means for connecting said redundant line in replacement of a line of the array if said line of the array comprises at least a defective cell, and means for connecting said redundant column in replacement of a column of the array if said column of the array comprises at least one defective cell, said memory further comprising for each group of a redundant line and column and storing means capable of storing either an address of a defective line or an address of a defective column but not both, said memory further comprising enabling means for either enabling memorization in said storing means of the address of a given line and enabling selection of a first connecting path allowing replacement of said given line by said redundant line, or enabling memorization in said storing means of the address of a given column and enabling selection of a second connecting path allowing replacement of said given column by said redundant column wherein said enabling means comprise a fusable link, the state of the fuse defining which memorization and selection in enabled, wherein a memory cell is addressable by means of N bits of address of line and P bits of address of column, and said storing means comprises a group of fusable links, the number of fusable links of said storing means being equal to whichever is the greater of N and P, wherein said enabling means comprises a further fusable link, the state of said fusable link defining which memorization and selection is enabled and wherein said enabling means comprises one respective logical gating circuit associated with each fusable link of the storing means, said logical gating circuit being connected to one bit of address of line and one bit of address of column, for directing towards the respective fusable link either one of said bits depending on the state of said further fusable link.

* * * * *